(12) United States Patent
Hankey et al.

(10) Patent No.: US 10,263,126 B2
(45) Date of Patent: Apr. 16, 2019

(54) CAVITATION APPARATUS AND METHOD OF USING SAME

(71) Applicant: Applied Cavitation, Inc., Goleta, CA (US)

(72) Inventors: Dana Lynn Hankey, Santa Barbara, CA (US); Marshall Campion Tibbetts, Goleta, CA (US); Joseph Capobianco, Marlton, NJ (US); Christopher Davey, South Easton, MA (US)

(73) Assignee: Applied Caviatation, Inc., Santa Barbara, CA (US)

( * ) Notice: Subject to any disclaimer, the term of this patent is extended or adjusted under 35 U.S.C. 154(b) by 0 days.

(21) Appl. No.: 14/655,312

(22) PCT Filed: Dec. 27, 2013

(86) PCT No.: PCT/US2013/077970
§ 371 (c)(1),
(2) Date: Jun. 24, 2015

(87) PCT Pub. No.: WO2014/106035
PCT Pub. Date: Jul. 3, 2014

(65) Prior Publication Data
US 2016/0193579 A1    Jul. 7, 2016

Related U.S. Application Data

(60) Provisional application No. 61/956,597, filed on Jun. 13, 2013, provisional application No. 61/848,177, (Continued)

(51) Int. Cl.
*B01F 15/06* (2006.01)
*H01L 31/0224* (2006.01)
(Continued)

(52) U.S. Cl.
CPC .... *H01L 31/022425* (2013.01); *B01F 3/0807* (2013.01); *B01F 3/0819* (2013.01); (Continued)

(58) Field of Classification Search
CPC .................................................... H01B 1/02
See application file for complete search history.

(56) References Cited

U.S. PATENT DOCUMENTS

| 1,471,758 A | 10/1923 | Tucker | |
| 5,318,225 A * | 6/1994 | Condron | B01F 3/088 239/1 |

(Continued)

FOREIGN PATENT DOCUMENTS

| CN | 1170371 | 1/1998 |
| CN | 101511918 | 8/2009 |

(Continued)

OTHER PUBLICATIONS

International Search Report and Written Opinion on PCT/US2013/077970 dated Apr. 16, 2014.

(Continued)

*Primary Examiner* — William D Young
(74) *Attorney, Agent, or Firm* — Foley & Lardner LLP

(57) ABSTRACT

Provided in one embodiment is a method of making, comprising: exposing a raw material having a first viscosity to a first pressure and a first temperature such that the raw material after the exposure has a second viscosity, wherein the raw material comprises particles comprising at least one electrically conductive material, and wherein the second viscosity is sufficiently low for the raw material to be adapted for a hydrodynamic cavitation process; and subjecting the raw material having the second viscosity to the hydrodynamic cavitation process to make a product material having a third viscosity. Apparatus employed to apply the (Continued)

method and the exemplary compositions made in accordance with the method are also provided.

30 Claims, 8 Drawing Sheets

Related U.S. Application Data filed on Dec. 27, 2012, provisional application No. 61/848,176, filed on Dec. 27, 2012, provisional application No. 61/848,178, filed on Dec. 27, 2012.

(51) Int. Cl.
| | |
|---|---|
| B01F 5/06 | (2006.01) |
| B01F 11/00 | (2006.01) |
| B01F 15/02 | (2006.01) |
| B01F 3/08 | (2006.01) |
| B01F 3/10 | (2006.01) |
| B01F 3/20 | (2006.01) |
| H01B 1/22 | (2006.01) |
| C09D 11/52 | (2014.01) |
| H01L 31/18 | (2006.01) |
| H01B 1/16 | (2006.01) |

(52) U.S. Cl.
CPC ............ *B01F 3/10* (2013.01); *B01F 3/2078* (2013.01); *B01F 5/0685* (2013.01); *B01F 5/0688* (2013.01); *B01F 11/0071* (2013.01); *B01F 11/0074* (2013.01); *B01F 15/0237* (2013.01); *B01F 15/065* (2013.01); *C09D 11/52* (2013.01); *H01B 1/16* (2013.01); *H01B 1/22* (2013.01); *H01L 31/18* (2013.01); *B01F 2015/061* (2013.01); *Y02E 10/50* (2013.01)

(56) References Cited

U.S. PATENT DOCUMENTS

2007/0003497 A1* 1/2007 Holloway, Jr. ....... B01F 3/0807
424/59

| | | | |
|---|---|---|---|
| 2008/0217211 A1 | 9/2008 | Chornet et al. | |
| 2009/0003123 A1* | 1/2009 | Morrison, Jr. ......... A61K 31/60 366/76.1 | |
| 2010/0020631 A1 | 1/2010 | Gansmuller et al. | |
| 2010/0076120 A1* | 3/2010 | Emmerson ............... C08J 3/203 524/1 | |
| 2011/0123716 A1 | 5/2011 | Lozman et al. | |
| 2012/0181216 A1 | 7/2012 | Kozyuk et al. | |

FOREIGN PATENT DOCUMENTS

| | | |
|---|---|---|
| CN | 101511918 A | 8/2009 |
| EP | 2 357 034 | 8/2011 |
| EP | 2 472 526 | 7/2012 |
| KR | 10-2011-0086155 | 7/2011 |
| KR | 2011-528278 | 11/2011 |

OTHER PUBLICATIONS

Korean Notice of Preliminary Rejection on 10-2015-7019948 dated Dec. 4, 2015.
Partial Supplementary European Search Report on 13867900.6 dated Dec. 1, 2015.
Extended European Search Report on 13867900.6 dated Apr. 22, 2016.
Chinese Office Action on 201380073992.4 dated May 2, 2016.
Korean Notice of Preliminary Rejection on 10-2015-7019948 dated Apr. 28, 2016.
CN Office Action for CN. Appl. 2013800739924 dated Jun. 21, 2017.
EP Office Action for EP App. No. 13867900.6 dated Apr. 24, 2017.
U.S. Office Action for U.S. Appl. No. 14/749,381, dated Oct. 11, 2017.
Communication pursuant to Article 94 (3) EPC for application No. 13 867 900.6-1019 dated Jun. 7, 2018.
Notification of the Fourth Office Action for application No. 201380073992.4 dated Mar. 29, 2018.
U.S. Appl. No. 14/749,381, filed Jun. 24, 2015.
U.S. Appl. No. 14/749,381, filed Dec. 27, 2013.

* cited by examiner

CAVITATION APPARATUS AND METHOD OF USING SAME

RELATED APPLICATIONS

This application is a U.S. National Stage filing of International Application No. PCT/US2013/077970, filed Dec. 27, 2013, which claims priority from US Provisional Applications Ser. No. 61/848,176, filed Dec. 27, 2012; Ser. No. 61/848,177, filed Dec. 27, 2012; Ser. No. 61/848,178, filed Dec. 27, 2012; and Ser. No. 61/956,597, filed Jun. 13, 2013, each of which is hereby incorporated by reference in its entirety.

BACKGROUND

Industry standard processes such as three-roll milling, attritor milling and bead milling are commonly used to fabricate dispersed particles, but these techniques suffer several drawbacks, including poor dispersity of the particles and the agglomeration of the particles in the product. Emulsifying equipment that is capable of cavitating very low viscosity materials, such as liquids, has been employed to replace the milling techniques. However, these cavitation systems are only capable of processing very low viscosity liquids; the capability of the system constrained by whether these materials are able to flow into the machine. These pre-existing systems are not equipped to process any medium or high viscosity materials because these types of materials would not be able to flow into the pre-existing cavitation systems. For example, in the pre-existing cavitation systems, not even yogurt may flow into the cavitation machine.

SUMMARY

In view of the foregoing, the Inventors have recognized and appreciated the advantages of the systems capable of converting a raw material into finely dispersed and non-agglomerated particles and the methods of achieving the conversion.

Accordingly, provided in one embodiment is a method of making, the method comprising: exposing a raw material having a first viscosity to a first pressure and a first temperature such that the raw material after the exposure has a second viscosity; wherein the raw material comprises particles comprising at least one electrically conductive material, and wherein the second viscosity is sufficiently low for the raw material to be adapted for a hydrodynamic cavitation process; and subjecting the raw material having the second viscosity to the hydrodynamic cavitation process to make a product material having a third viscosity.

Provided in another embodiment is an apparatus system, comprising: a first feed tube configured to contain a raw material, which has a first viscosity and is to be supplied into a hydrodynamic cavitation chamber that is downstream and separate from the apparatus system; and an air-driven piston configured to create a condition having a first pressure and a first temperature sufficiently high to reduce the first viscosity to a second viscosity being sufficiently low for the raw material to be pushed into an orifice of the hydrodynamic cavitation chamber to undergo a hydrodynamic cavitation process to form a product material.

Provided in another embodiment is a composition, comprising: particles comprising an electrically conductive material; at least two glass materials; at least one organic solvent; and at least one polymer material. The composition may be a part of a raw material subjected to a hydrodynamic cavitation process.

Provided in another embodiment is a non-transitory computer-readable medium, stored thereon a program, which when executed by at least one processor is configured to execute a method comprising: exposing a raw material having a first viscosity to a first pressure and a first temperature such that the raw material after the exposure has a second viscosity, wherein the raw material comprises particles comprising at least one electrically conductive material, and wherein the second viscosity is sufficiently low for the raw material to be adapted for a hydrodynamic cavitation process; and subjecting the raw material having the second viscosity to the hydrodynamic cavitation process to make a product material having a third viscosity.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Figure 1:
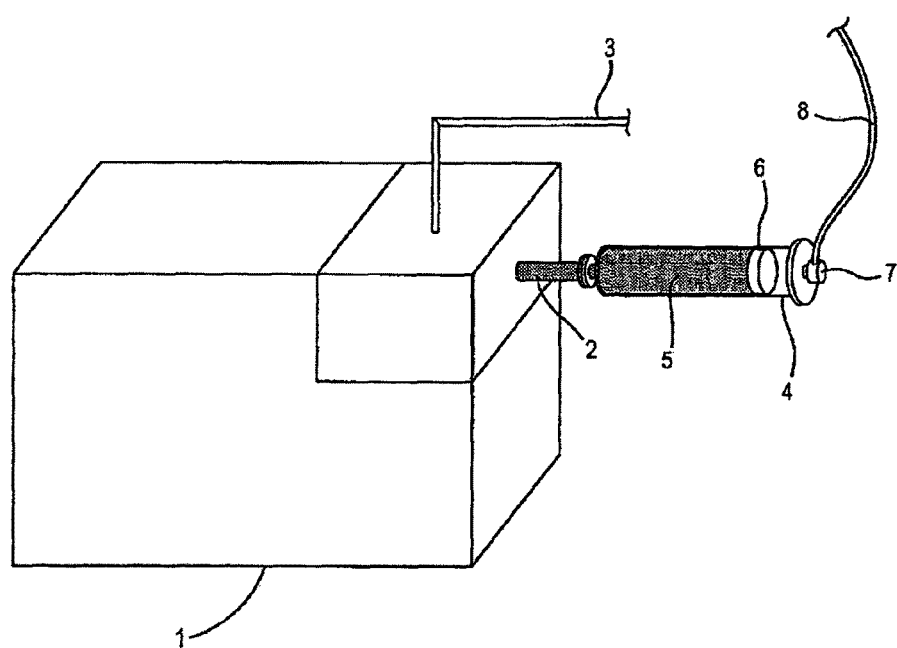
FIG. 1 provides a schematic of a cavitation or emulsifying apparatus system in one embodiment, wherein the system comprises a base machine unit that is commercially available and an apparatus system that facilitates feeding a raw material into the base machine unit.

Following below are more detailed descriptions of various concepts related to, and embodiments of, an inventive system capable of converting a raw material into finely dispersed and non-agglomerated particles and the method of achieving the conversion. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Cavitation

Cavitation may refer to the formation of vapor cavities in a liquid (e.g., small liquid-free zones such as "bubbles" or "voids") that are formed as a result of forces acting upon the liquid. The process generally may occur when a liquid is subjected to rapid changes of pressure that cause the formation of cavities where the pressure is relatively low. When subjected to higher pressure, the voids may implode and may generate an intense shockwave. Depending on the application, any suitable mode of cavitation may be employed in the methods and systems provided herein. For example, the cavitation process in one embodiment may involve, or be, hydrodynamic cavitation.

Hydrodynamic cavitation may refer to a process of vaporization, bubble generation, and bubble implosion, which occurs in a flowing liquid as a result of a decrease and subsequent increase in pressure. Hydrodynamic cavitation may be produced by passing a liquid through a constricted channel at a specific velocity or by mechanical rotation of an object through a liquid. In the case of the constricted channel and based on the specific (or unique) geometry of the system, the combination of pressure and kinetic energy may create the hydrodynamic cavitation cavern downstream of the local constriction generating high energy cavitation bubbles.

Orifices and venturi may be used for generating cavitation. A venturi may be employed because of its smooth converging and diverging sections, such that that it may generate a higher velocity at the throat for a given pressure drop across it. On the other hand, an orifice may accommodate more numbers of holes (larger perimeter of holes) in a given cross sectional area of the pipe. Both options are possible.

Some of the pre-existing cavitation systems utilize opposing water jets to create the pressure needed for cavitation to occur while others create the pressure and resulting vacuum by having hydraulic pumps driving and oscillating plungers which draw the low viscosity materials in and then pushes the low viscosity material through the specific point where cavitation occurs. However, none of these pre-existing systems is equipped to handle a raw material that has a viscosity larger than that of a fluid, to disperse the constituents, or to attain the desired particle size distribution through de-agglomeration.

Cavitation Equipment

Depending on the application, any suitable equipment capable of carrying out a cavitation or an emulsifying process may be employed. Provided in one embodiment is an apparatus system, comprising: a first feed tube adapted to contain a raw material, which has a first viscosity and is to be supplied into a hydrodynamic cavitation chamber that is downstream and separate from the apparatus. The system may also comprise an air-driven piston configured to create a condition having a first pressure and a first temperature sufficiently high to reduce the first viscosity to a second viscosity being sufficiently low for the raw material to be pushed into an orifice of the hydrodynamic cavitation chamber to undergo a hydrodynamic cavitation process to form a product material.

FIG. 1 provides a schematic illustration of a base cavitation or emulsifying machine 1. The machine comprises an inlet 2 and an outlet 3. The machine may be a commercially available cavitation machine or may be a custom-designed cavitation machine. The base cavitation machine 1 is described further below in FIG. 2. The apparatus system provided herein configured to feed the raw material into the base cavitation machine 1 may refer to the system that is attached to the base cavitation machine 1, such as at the inlet 2 thereof. Alternatively, the apparatus system provided herein may refer to a fabrication system comprising a combination of both the base cavitation machine 1 and the attached system, as shown in FIG. 1.

Referring to FIG. 1, the apparatus system may comprise at least one feed tube 4, a raw material 5 inside the feed tube 4, and a piston 6 that pushes the material down the feed tube 4, forcing it into the inlet 2 of the machine 1. The apparatus system may also comprise an air valve 7 on the back end of the feed tube 4, which air valve 7 controls the flow of compressed air into the feed tube 4. The apparatus system may comprise an air line 8, which feeds compressed air into the air valve 7 and into the feed tube 4 from a source of compressed air.

The base cavitation machine 1 may comprise any suitable components, depending on the application. For example, the base cavitation machine may comprise two hydraulic pumps which are utilized to push the paste through a very small orifice, into a very small vacuum chamber, and out another very small orifice that creates a specific desired back pressure. In one embodiment, this combination of small orifices with a vacuum chamber in the middle is where the hydrodynamic cavitation occurs.

Figure 2:
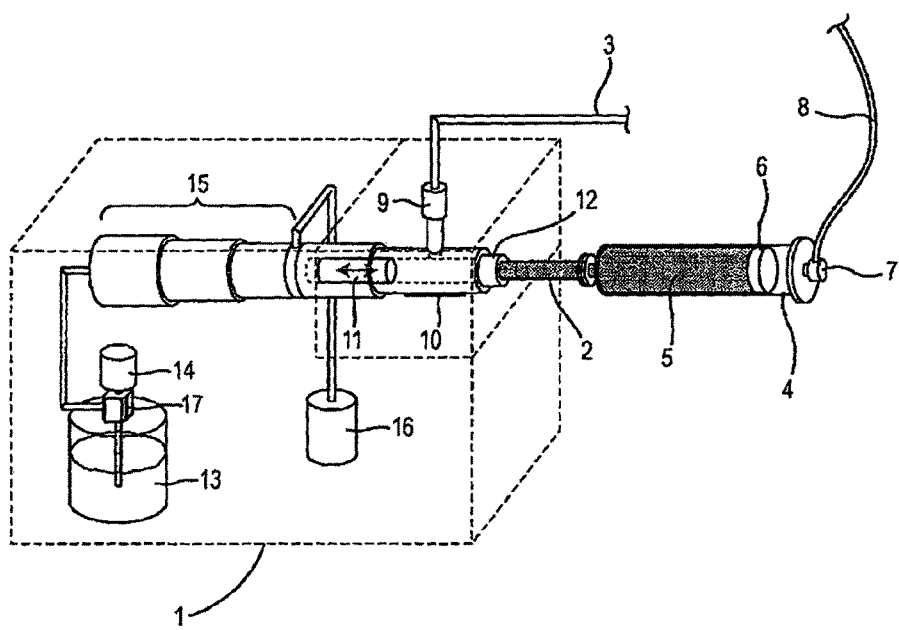
FIG. 2 provides a schematic of another embodiment of an apparatus system further showing the different components of the base machine unit of the apparatus system as shown in FIG. 1.

Referring to FIG. 2, the base cavitation machine 1 in one embodiment may comprise a hydraulic reservoir 13, a motor 14, which runs a pump 17, to pump the hydraulic oil up to an intensifier 15, which drives the oscillating plunger 11 that pushes the material up into the cavitation chamber 9, while the ball check system 12 closes to allow the material to be forced into the cavitation chamber, where the orifices are housed and the cavitation takes place. As the intensifier 15 pushes the plunger 11 forward, hydraulic oil in the front of the intensifier 15 is pushed against a nitrogen bag 16. After the plunger 11 is all the way forward, a positioning sensor stops the hydraulic pump 17 from driving the intensifier 15, and the pressure accumulates against the nitrogen bag 16, causing the plunger 11 to be pushed back to its starting position.

Depending on the application, the setups, including the number of feed tubes, may be varied. In one embodiment, a small single feed tube containing the medium to high viscosity raw material may be employed for small batches that may be tested after each pass through the cavitation machine. The cavitation process may generate a lot of heat in the material being processed. In one embodiment, a thermal control system may be employed to control the temperature of the product material as it exits the cavitation machine 1 so that the material may exit the cavitation process at an appropriate and stable temperature. The temperature is preferably below a thermal degradation temperature of the product material. The thermal degradation temperature is a function of the material properties of the constituents of the material. For example, downstream from the cavitation chamber, one embodiment of the apparatus system described herein may further comprise a thermal control system, which comprises at least one of a heat exchanger, a thermal couple, and a cooling fluid reservoir configured to supply the fluid to cool the product material discharged from the hydrodynamic cavitation chamber. The thermal control system may be configured to control the second temperature to be below a thermal degradation temperature of the raw material.

Figure 3:
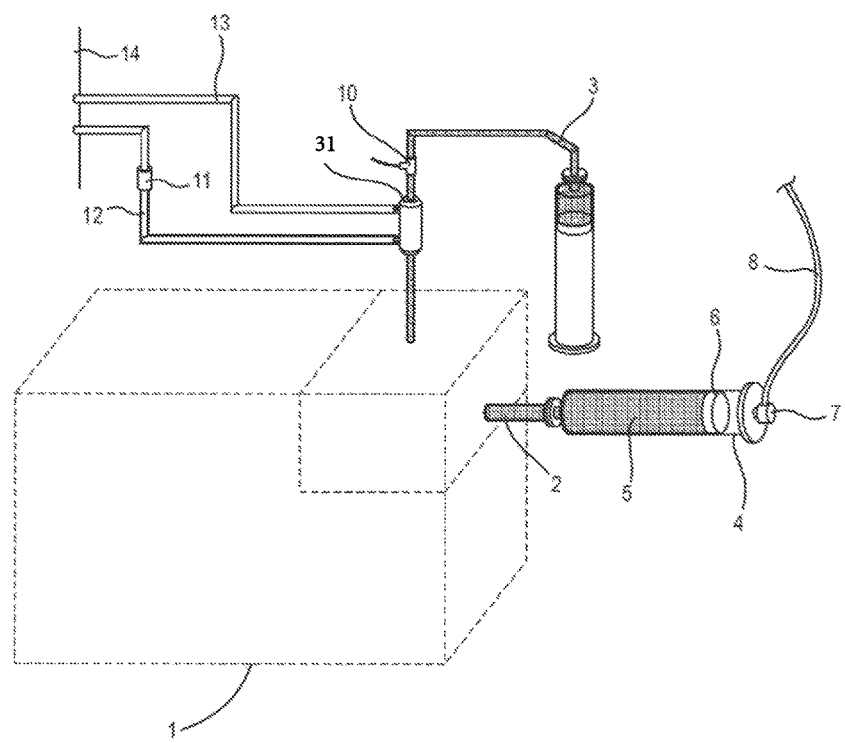
FIG. 3 provides a schematic of another embodiment of an apparatus system further showing the different components of a thermal control system as an optional additional component of the apparatus system as shown in FIG. 1.

FIG. 3 provides a schematic illustration of the configuration of the apparatus system in one embodiment comprising a thermal control system. Referring to FIG. 3, the thermal control system may comprise a heat exchanger 31 inline directly after the material exits the cavitation process. The heat exchanger 31 may be followed (downstream) by a thermal couple 10, which is configured to read the temperature of the material after the material has passed the heat exchanger 31. Chilled water may be applied to the heat exchanger using at least a water valve 11, which allows water to flow from a chilled water source 14 to the heat exchanger 31 via water tubing 12 through the heat exchanger 31, then out of the heat exchanger 31 and back to the return water connection of the chilled water via water tubing 13.

The flow of the water may be controlled manually or automatically, such as by a software program. In one embodiment, a predetermined temperature may be inputted into a software program that, when executed, causes at least one processor to execute the thermal control system. In another embodiment, the feedback from the thermal couple may enable the software to adjust the water valve 11 such that the temperature of the material exiting the thermal control system is within a desired range. In one embodiment, the material is processed in a single discrete pass and delivered to a second tube via the outlet 3. The tubes are then interchanged and the process may be repeated for as many passes as needed to achieve the desired product material properties.

Figure 4:
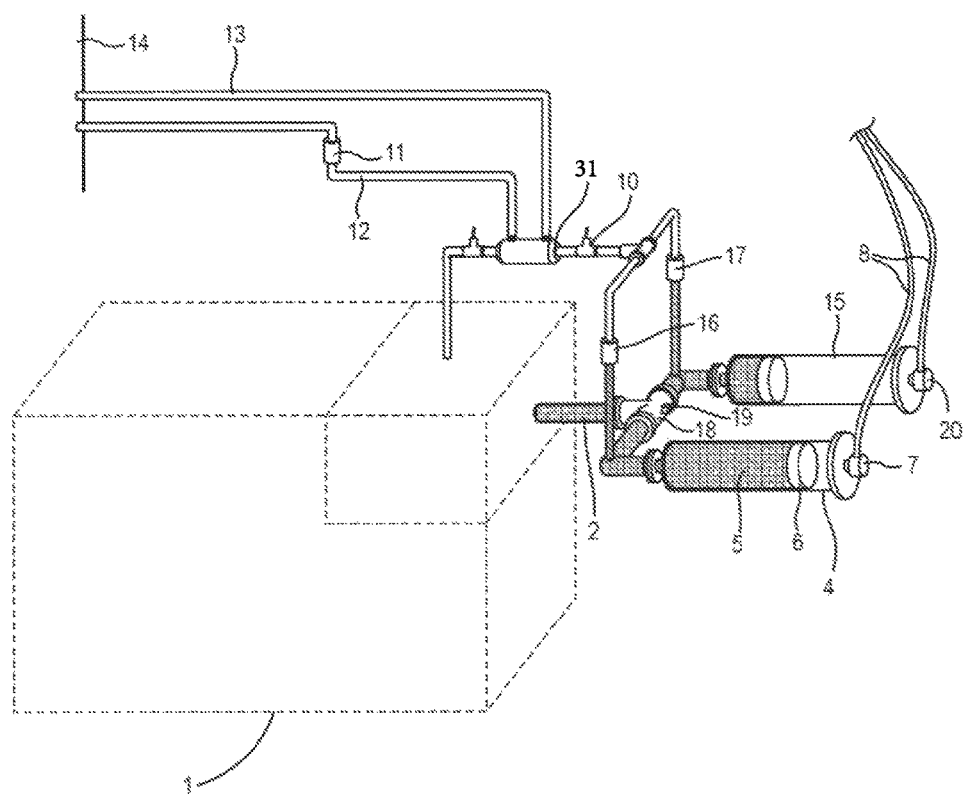
FIG. 4 provides a schematic of another embodiment of an apparatus system further showing a closed, automated system comprising different valves as an optional additional component of the apparatus system as shown in FIG. 1.

FIG. 4 provides a schematic illustration of an alternative embodiment of the apparatus system described herein. This embodiment further comprises a closed system that allows and/or facilitates multiple cavitation passes. The closed system, which is further downstream from the thermal control system, may further comprise a second feed tube; a plurality of two-way valves and three-way valves configured to resupply the product material back into the hydrodynamic cavitation chamber to repeat the hydrodynamic cavitation process; and a pressure transducer. This embodiment may be suitable for a larger-scale production than the smaller (e.g., R&D) embodiment described above. One benefit of the closed system described herein is mitigation (such as complete elimination) of exposure to contamination (e.g., air).

In addition to the thermal control system as shown in FIG. 3, the apparatus system as shown in FIG. 4 may additionally comprise two tubes of similar size that are set up with air driven pistons. In one embodiment, the size of the tubes may be a factor to determine the batch size, although there is no limit as to the amount of the material that may be processed by the system described herein. The automation that may be applied to the system as described in FIG. 3 may similarly be applied to the systems described in FIG. 4. For example, the automated system may use valves which control the direction of the material as it goes into and out of the cavitation machine 1, and out of and into the feeding apparatus system described herein. (See e.g., FIG. 1).

Referring to FIG. 4, the closed system comprises two-way valves 16 and 17, which control the direction of the material when it is being pushed into the system, as well as the direction the material travels after it exits the heat exchanger 31. The system may further comprise a three way valve 18, which is desirably in sync with the two-way valves 16 and 17 in order for the material to travel into the cavitation machine 1. In one embodiment, when the material in tube 4 is forced down the tube by the air driven piston 6, the two-way valve 16 must be closed so that the material travels past that valve and to the three-way valve 18. When the material is in tube 4, the three-way valve 18 allows the material to travel from tube 4 into the cavitation machine 1.

After cavitation takes place, the material travels through the thermal control system and out of the heat exchanger 31, and past the thermal couple 10. At this point, the material then travels through the open two-way valve 17 and then into tube 15, pushing the air-driven piston down the tube towards the back of the tube where the air valve 20 supplies air to the piston in tube 15. During this process of moving the material from tube 4 to tube 15, the air valve 20 is open so that air is able to be pushed out of tube 15 as it fills with material and the piston 6 is forced towards the back of tube 15. When tube 4 is empty, the piston 6 inside hits the front of tube 4, and there is no more pressure on the material being forced into the machine.

A pressure transducer 19, which is located near the inlet of the machine by the three-way valve, may transmit this drop in pressure to a software, which then causes at least one processor to switch the two-way valves and three-way valves so that the material will travel from tube 15 back through cavitation machine 1 and back into tube 4. Once the valves have switched (17 closed, 16 open, and 18 switched) so that material travels from tube 15 into cavitation machine 1, the air valve 20 may automatically turn on and force the piston 6 and the material down tube 15 through the entire process and back to tube 4.

An operator/user may choose the number of times the material will pass through the cavitation machine, thereby repeating the cavitation and/or cooling processes (by the thermal control system). In one embodiment, after the pre-determined number of passes is achieved, the system, as well as the air driving the valves and pistons, may automatically shut off. This safety feature may release the air pressure once the current cycle is completed. In one embodiment, the system setups described herein allow samples of the material to be taken at any time to determine if the desired results have been achieved after a certain number of passes at the desired operating pressure(s) and temperature(s).

In one embodiment, the apparatus systems provided herein may control the temperature of the material by at least one of software and several thermal couples used to determine the temperature of the material at several points in the process and actuate a water valve, which controls the flow of chilled water to the heat exchanger put inline directly after the cavitation takes place. In one embodiment, the material is cooled after cavitation to reduce the temperature to a range that is suitable for the material being processed so that it remains stable and ready for the next cycle or pass. Without this temperature control system, the material in at least one embodiment may retain too much heat and may gain even more heat energy though each pass, resulting in damaging some of its constituents. When the material is processed with set parameters for pressure and temperature, which may be determined for each material through trial and errors and/or parametric studies, the consistency of the product from lot to lot is surprisingly far superior to any other pre-existing process for preparing medium to high viscosity inks, pastes, slurries or dispersions of nano-particles. The ability to move medium to high viscosity materials in a continuous and controlled manner through the cavitation process by the apparatus systems and methods described herein is unexpected over the pre-existing methods.

Fabrication Process

Provided in one embodiment is a method of making, the method comprising: exposing a raw material having a first viscosity to a first pressure and a first temperature such that the raw material after the exposure has a second viscosity; and subjecting the raw material having the second viscosity to the hydrodynamic cavitation process to make a product material having a third viscosity. The raw material may comprise particles comprising at least one electrically conductive material. In one embodiment, the second viscosity may be sufficiently low for the raw material to be adapted for a cavitation process, such as a hydrodynamic cavitation process.

Depending at least on the equipment involved, the method of making may include a number of additional processes. For example, in the case as shown in FIG. 3, the method may further comprise cooling the product material to a predetermined second temperature using a thermal control system, including, for example, at least a feedback temperature control. The first temperature and the first pressure may be generated by any suitable techniques. In one embodiment, the first pressure may be generated by using at least an air-driven piston. Also, the first temperature may be generated by forcing the raw material having the first viscosity through at least one orifice of a hydrodynamic cavitation chamber in which the hydrodynamic cavitation process takes place. In one embodiment, the process of forcing the material into the cavitation chamber (through the small orifice) may generate a lot of heat. The elevated temperature as a result of the addition of this heat may be controlled subsequently through the thermal control system as described above. The driving-through-piston technique need not be the only method to heat up the raw material (to arrive at the first temperature/pressure) and any other suitable methods may be used. For example, a heat blanket may be employed to generate the first temperature. Further, in some embodiments, the material may undergo hydrodynamic cavitation processes multiple times. For example, the method may further comprise comprising repeating the exposing and subjecting steps at least once. In another embodiment, depending on the setup, at least one of the subjecting and the exposing steps takes place in a closed system.

Figure 5:
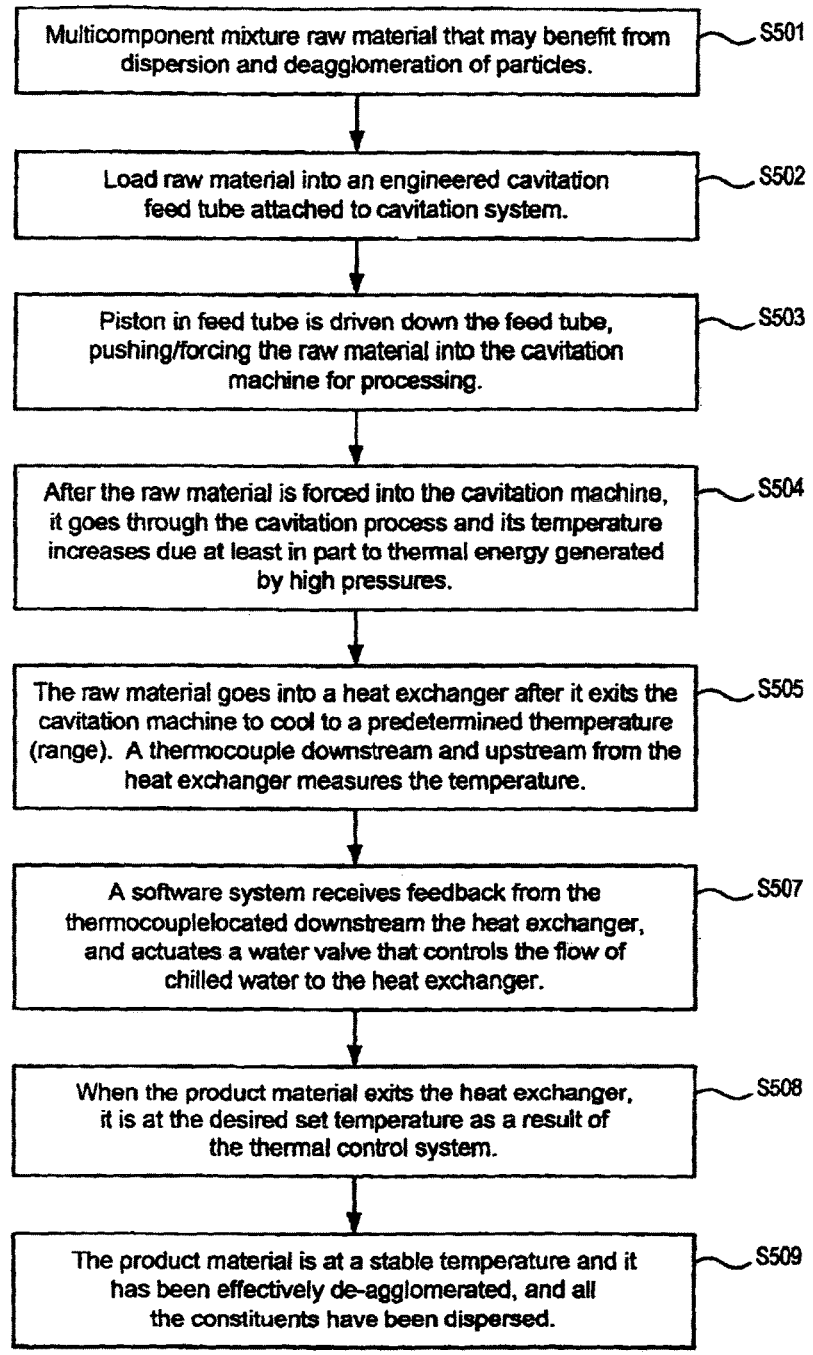
FIG. 5 provides a schematic flowchart illustrating in one embodiment a fabrication process using the apparatus system described in FIG. 3.

In some embodiments, the apparatus systems described herein allow the raw material to be preconditioned so that the raw material may be fed into the base cavitation machine. FIG. 5 provides a flowchart illustrating in one embodiment a process of making a product material using a system as shown in FIG. 3. As shown in FIG. 5, the raw material takes the form of a multicomponent mixture that may benefit from dispersion and de-agglomeration of the particles therein (S501). The raw material is loaded into an engineered cavitation feed tube, which is attached to a cavitation system (S502). A piston in the feed tube is then driven down the feed tube (pneumatically in this example), pushing/forcing the raw material into the cavitation machine for processing (S503). After the raw material is forced into the cavitation machine, the material goes through the cavitation process and the temperature thereof increases due at least in part to thermal energy generated by high pressures (S504). The raw material then goes into a heat exchanger after it exits the cavitation process to cool to a predetermined temperature (or temperature range) (S505), during which a thermocouple measures the temperatures downstream and/or upstream from the heat exchanger. A software program/system then receives feedback from the thermocouple located downstream from the heat exchanger, and actuates a water valve that controls the flow of chilled water to the heat exchanger (S506). When the product exits the heat exchanger, it is at the desired predetermined temperature at least as a result of the thermal control system (S507). As a result, the product material is at a stable temperature and it has been effectively de-agglomerated and all the constituents have been dispersed from the multicomponent mixture raw material (S508).

Figure 6:
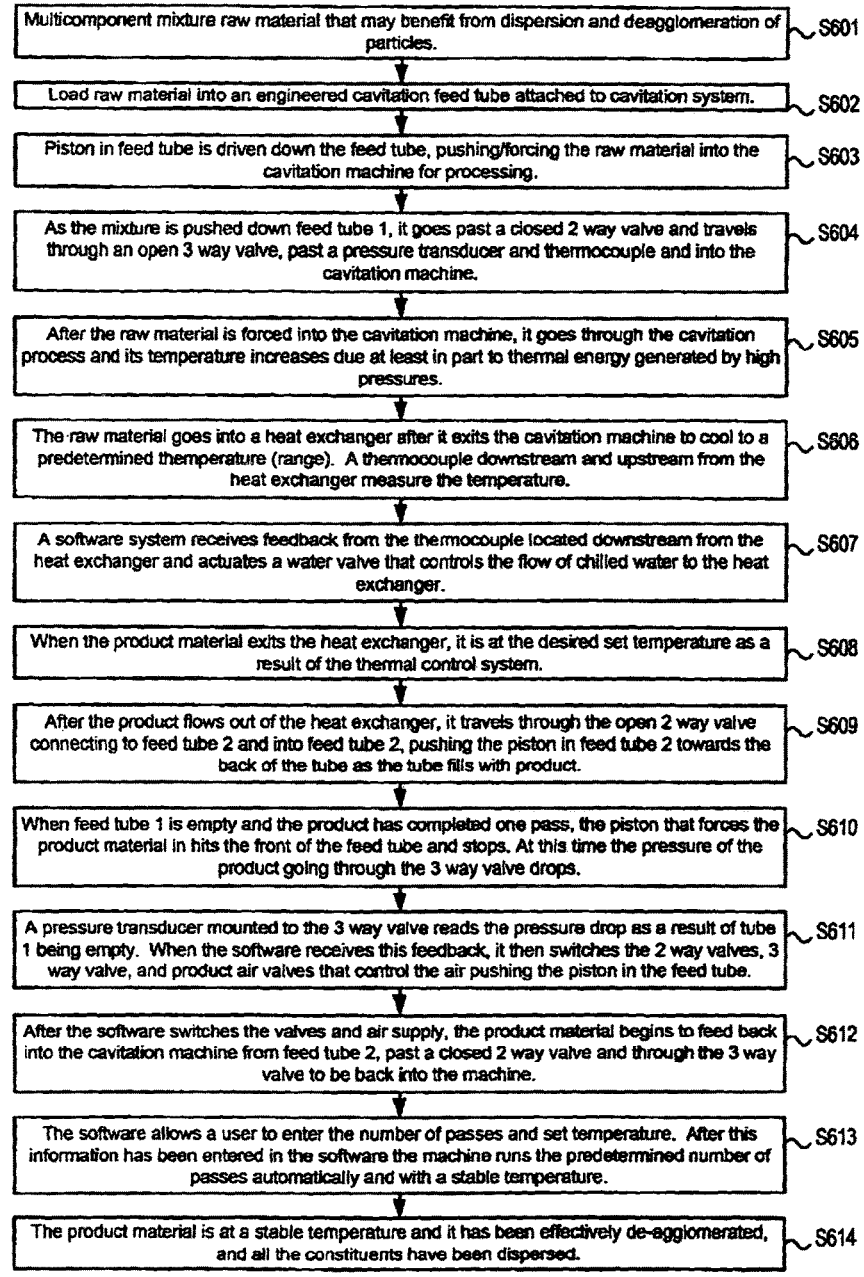
FIG. 6 provides a schematic flowchart illustrating in one embodiment a fabrication process using the apparatus system described in FIG. 4.

In some embodiments, the apparatus systems described herein allow the raw material to undergo the cavitation process multiple times. FIG. 6 provides a flowchart illustrating in one embodiment a process of making a product material using a system as shown in FIG. 4. As shown in FIG. 6, the raw material takes the form of a multicomponent mixture that may benefit from dispersion and de-agglomeration of particles (S601). The raw material is loaded into an engineered cavitation feed tube, which is attached to a cavitation system (S602). A piston in the feed tube is then driven down the feed tube (pneumatically in this example), pushing/forcing the raw material into the cavitation machine for processing (S603). As the mixture is pushed down feed tube 1, it goes past a closed two-way valve and travels through an open three-way valve, past a pressure transducer and thermocouple and into the cavitation machine (S604). After the raw material is forced into the cavitation machine, the material goes through the cavitation process and the temperature thereof increases due at least in part to thermal energy generated by high pressures (S605). The raw material then goes into a heat exchanger after it exits the cavitation process to cool to a predetermined temperature (or temperature range) (S606), during which a thermocouple measures the temperatures downstream and/or upstream from the heat exchanger. A software program/system then receives feedback from the thermocouple located downstream from the heat exchanger, and actuates a water valve that controls the flow of chilled water to the heat exchanger (S607). When the product exits the heat exchanger, it is at the desired predetermined temperature at least as a result of the thermal control system (S608). After the product flows out of the heat exchanger, it travels through the open two-way valve connecting to feed tube 2 and into feed tube 2, pushing the piston in feed tube 2 towards the back of the tube (S609). When feed tube 1 is empty and the product has completed one pass, the piston that forces the product then hits the front of the feed tube and stops; at this time the pressure of the product going through the three-way valve drops (S610). A pressure transducer mounted to the three-way valve reads the pressure drop as a result of tube 1 being empty—when the software receives this feedback, it switches the two-way valves, three-way valve, and product air valves that control the air pushing the piston in the feed tube (S611). After the software switches the valves and air supply, the product material begins to feed back into the cavitation machine from feed tube 2, past a closed two-way valve and through the three-way valve to return into the machine (S612). The software allows a user to enter the number of passes and set the temperature; after this information has been entered into the software, the machine will run the set number of passes automatically and with a stable temperature (S613). The product material is at a stable temperature; it has been effectively de-agglomerated and all the constituents have been dispersed from the multicomponent mixture raw material (S614).

The method and apparatus systems provided herein allow raw material with a higher viscosity to be subject to a cavitation process (e.g., hydrodynamic cavitation process), in comparison to those allowed in a pre-existing cavitation process. The values of the viscosities described herein are material-dependent and thus any of the values of the viscosities discussed herein are meant only for illustration purpose and not to be limiting. Also, the values of the viscosities may refer to the values measured at the particular instant of measurement during a particular point of the process (and hence at the particular pressure and/or temperature at that particular point of time).

Because the second viscosity may be important for the raw material to be pushed into the cavitation, the fabrication methods described herein may further comprise determination of the suitable first pressure and first temperature so as to achieve the second viscosity. The determination may involve parametric studies and/or trial and errors. The determination may be optimized by using a certain algorithm or computer database containing material properties of the different constituent materials used in the raw material.

The first temperature and the first pressure are dependent on the processing conditions and material properties. In one embodiment, the first temperature may be between about 20° C. and about 100° C.—e.g., between about 25° C. and about 80° C., between about 30° C. and about 60° C., between about 35° C. and about 50° C., between about 40° C. and about 50° C., etc. Other values are also possible, depending on the application.

In one embodiment, the first pressure may be between 100 psi and about 100,000 psi—e.g., between 500 psi and about 80,000 psi, between 1,000 psi and about 50,000 psi, between 2.000 psi and about 10,000 psi, between 3,000 psi and about 5,000 psi, etc. Other values are also possible, depending on the application.

In one embodiment of the method described herein, the first viscosity at room temperature may be at least about 1 Kcps—e.g., at least about 5 Kcps, about 10 Kcps, about 20 Kcps, about 40 Kcps, about 60 Kcps, about 80 Kcps, about 100 Kcps, about 150 Kcps, about 200 Kcps, about 250 Kcps, about 300 Kcps, about 350 Kcps, about 400 Kcps, about 500 Kcps, about 600 Kcps, about 700 Kcps, about 800 Kcps, about 900 Kcps, about 1000 Kcps, or higher. There is no upper limit for the first viscosity. There is also no lower limit for the first viscosity, as the methods and system described herein are equipped to handle the low viscosity materials that are processed by pre-existing cavitation techniques.

The second viscosity may generally be lower than the first viscosity due at least in part to the process of subjecting the raw material to the first temperature and the first pressure. The second viscosity varies with the material and also varies with the first pressure and the first temperature. For example, the second viscosity may be about 10% to about 90% of the first viscosity—e.g., about 20% to about 80%, about 30% to about 70%, about 40% to about 60%, about 45% to about 55%, etc. of the first viscosity. In one embodiment, the second viscosity is about 25% to about 50% of the first viscosity.

The third viscosity (of the product material) may generally be lower than the first viscosity. The third viscosity varies with the material and also varies with the processing conditions the material has been subjected to. For example, the second viscosity may be about less than about 90% of the first viscosity—e.g., less than about 80%, about 75%, about 70%, about 65%, about 60%, about 55%, about 50%, about 45%, about 40%, about 35%, about 30%, or less. In one embodiment, the third viscosity is equal to about 50% of the first viscosity. In some instances, the third viscosity is higher than the second viscosity once the pressure is released and/or the temperature of the product material is cooled.

The product material as a result of the fabrication methods described herein may be further employed to make a variety of devices. For example, the method may further comprise disposing the product material onto a substrate to form a pattern on the substrate, which substrate is a part of a device. The device may be any of the devices described in a later section. The pattern may be, for example, gridlines.

As described above, any part of the method, when used in conjunction with the apparatus systems described herein, may be automated. The automation may be accomplished at least in part using a software program. In one embodiment, the software program is stored on a non-transitory computer-readable medium. The program, when executed, causes at least one processor (such as a computer) to execute any of the methods (or portions thereof) described herein.

The methods and apparatus systems provided herein allow the size of raw material to be reduced, dispersed, and/or de-agglomerated. The raw material may comprise a plurality of particles. The particles may have any geometry, including shapes and sizes. For example, the particles may have a shape that comprises a sphere, a sheet, a flake, a frit, an ellipsoid, or an irregular shape. The particle may be of any size. The term "size" referred to herein may refer to the diameter, radium, length, width, height, etc., depending on the context and geometry of the particle. In one embodiment, when the term "size" is used to describe a plurality of particles, the size may refer to an average size of the plurality.

Figure 7:
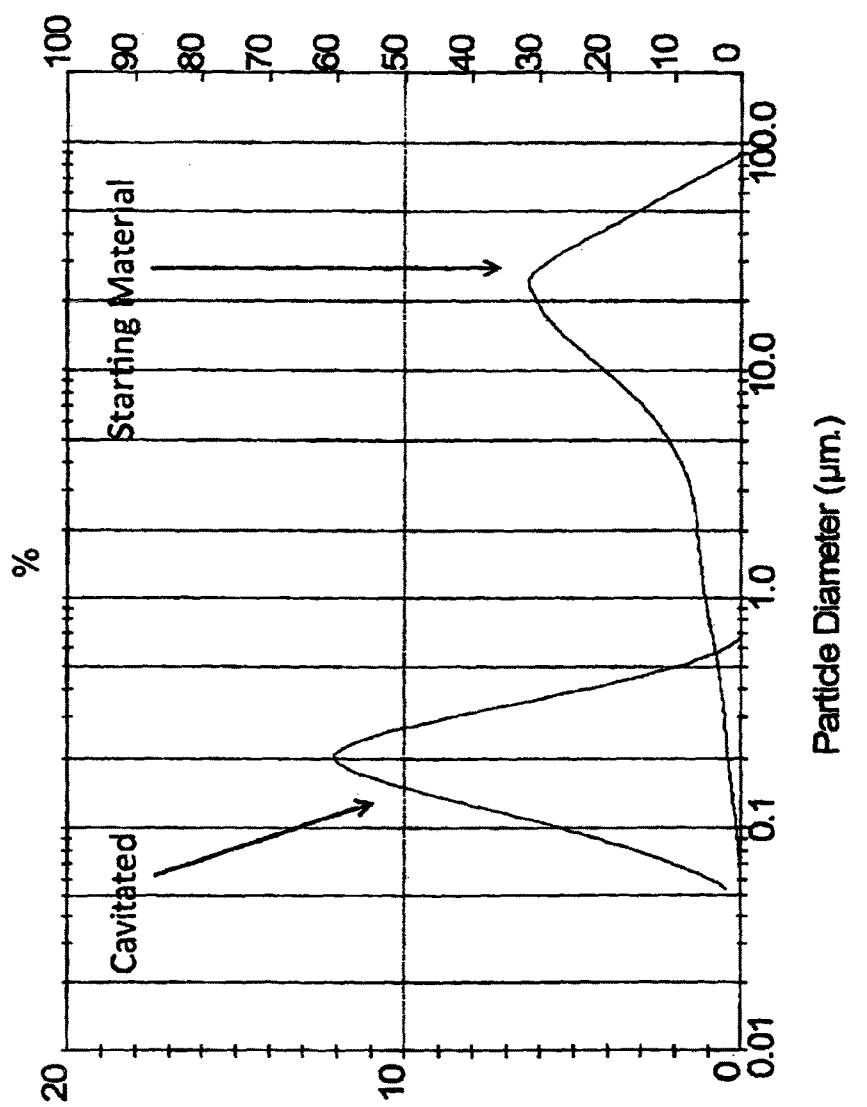
FIG. 7 illustrates particle size distribution for Ag particles in one embodiment prior to a cavitation process ("starting material") and after a cavitation process ("cavitated") as provided in one exemplary cavitation process.

In one embodiment, the method may comprise reducing a first size of the particles contained in the raw material to form particles having a second size in the product material, the second size being smaller than the first size. The first size may be in the nanometer range or micrometer range. For example, the first (average) size of the particles may be between about 0.05 microns and about 100 microns—e.g., about 0.1 microns and about 50 microns, about 0.5 microns and about 10 microns, between about 0.25 microns and about 1 micron, etc. On the other hand, the second (average) size of the particles may be between about 0.05 microns and about 10 microns—e.g., about 0.1 microns and about 3 microns, about 0.1 microns and about 1 micron, between about 0.25 microns and about 1 micron, about 0.2 microns and about 0.5 microns, etc. The particle size reduction effect of the methods and systems described herein in one embodiment is shown in FIG. 7. As shown in FIG. 7, experimental data show that the methods and systems described herein reduce the average size of Ag particles from greater than about 20 microns to about 0.2 microns. Additionally, after the process described herein, the particles exhibit a much tighter/narrower distribution than those before the process.

Figure 8:
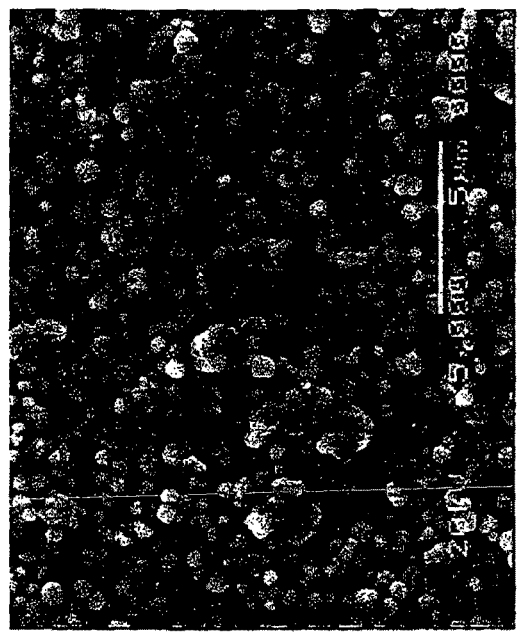
FIGS. 8(a)-8(b) provide scanning electron microscopy ("SEM") images of particles in one embodiment prior to a cavitation process (a) and after a cavitation process (b) as provided in one exemplary cavitation process.
Figure 8:
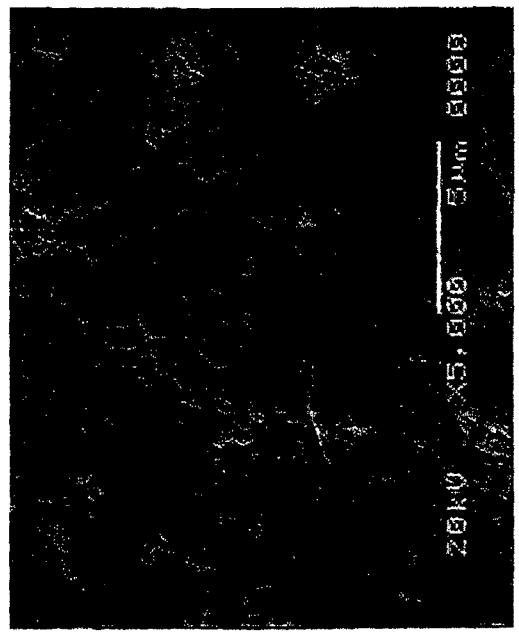

The reduction in size may be due in part to de-agglomeration of the particles. In other words, the method may comprise de-agglomerating the particles having a first size contained in the raw material to form particles having a second size in the product material, the second size being smaller than the first size. FIG. 8(a) and FIG. 8(b) illustrate the contrast in one embodiment between particles before and after de-agglomeration as a result of the cavitation process described herein. During de-agglomeration, the particles may be dispersed such that no visually observable agglomeration of the particles is observed in the product material.

One surprising result of using the systems and methods described herein to fabricate a product material comprising particles is that the particles in the product material may remain de-agglomerated for a period of time. In one embodiment, the metric used to describe the phenomenon of the particles in the product material remaining at least substantially de-agglomerated may be the lack of visually observable change (e.g., increase) in the size of the particles after a period of time. Visual observation may be carried out by naked eye, an optical microscope, an electron microscope, and the like. In one embodiment, the particles of the product material may remain at least substantially (or completely) free of agglomeration for at least about 1 month—e.g., at least about 2 months, about 3 months, about 5 months, about 6 months, about 7 months, about 8 months, about 9 months, about 10 months, about 11 months, about 1 year, about 1.5 years, about 2 years, about 3 years, about 4 years, about 5 years, or longer. Based on experimental data available to date to the inventors, no observable agglomeration was observed after at least about 2 years.

Composition

The methods and systems described herein are versatile with respect to the types of raw material they may be employed to process. Several material properties, including viscosity, geometry, size, etc., of the raw material have already been described above. The raw material may also comprise a plurality of different materials. In one embodiment, the raw material may comprise a composition comprising particles comprising an electrically conductive material; at least one glass material; at least one organic solvent; and/or at least one polymer material. In one embodiment, the raw material comprises a composition comprising the particles comprising silver, at least one glass material, at least one organic solvent, and at least one polymer material. In one embodiment, the raw material may comprise a composition comprising particles comprising an electrically conductive material; at least two glass materials; at least one organic solvent; and at least one polymer material. Any of the constituent particles can have any of the particle sizes as described above.

Depending on the constituents of the raw material, the raw material may have a variety of particle sizes because each of the constituents may have a different particle size from the others. In some embodiments, some of the constituents have similar or the same sizes. For example, the glass material and the electrically conductive material may have similar or the same sizes. In some embodiments, all of the constituents have different sizes. In one embodiment, the raw material may comprise at least two average particle size distributions—e.g., at least 3, 4, 5, 6, 7, 8, or more.

The electrically conductive material may comprise any suitable material that is electrically conductive, depending on the application. For example, it may comprise a metal, an alloy, a semiconductor, and/or a carbon-based material that is electrically conductive. In one embodiment, the electrically conductive material comprises at least one of: Ag, Pd, Au, Pt, Ni, Cu, Ru, or an alloy thereof. A composite/mixture thereof is also possible. In another embodiment, the electrically conductive material comprises at least one of: carbon black, graphene, carbon nanotubes, and graphite.

The glass material may comprise any type of suitable glass material, depending on the application. The glass material may comprise silicate glass. The silicate may comprise a borosilicate. The borosilicate may comprise any type of borosilicate glass. For example, the borosilicate glass may comprise a Pb-containing borosilicate glass. Alternatively, the borosilicate glass may comprise a non-Pb-containing borosilicate glass. In one embodiment, the glass may comprise a bismuth-containing borosilicate glass. In another embodiment, the glass may comprise a tellurium-containing borosilicate glass. The raw material may comprise at least two glass materials—e.g., at least 3, 4, 5, 6, 7, 8, or more. In one embodiment, the raw material comprises at least two glass materials, comprising: a first glass material having a first transition temperature; a second glass material having a second transition temperature, the second transition temperature being higher than the first transition temperature. In one embodiment, a weight ratio of the first glass material and the second glass material in the raw material is 8:1. Other ratios, such as 10:1, 15:1, 20:1, etc., are also possible, depending on the application.

The glass material may have any suitable material properties, depending on the application. For example, the glass material may have a softening temperature between about 300° C. and about 500° C.—e.g., between about 350° C. and about 480° C., between about 400° C. and about 460° C., between about 410° C. and about 450° C., between about 420° C. and about 440° C., etc. Other softening temperature values are also possible, depending on the material.

The glass material may have a glass temperature between about 200° C. and about 500° C.—e.g., between about 250° C. and about 450° C.; between about 300° C. and about 400° C.; between about 320° C. and about 385° C.; between about 340° C. and about 370° C.; between about 350° C. and about 360° C., etc. Other glass transition temperature values are also possible, depending on the material.

The organic solvent may comprise any type of suitable organic solvent, depending on the application. The organic solvent may comprise at least one of an alcohol, an aliphatic, an aromatic, a ketone, ethyl acetates, and an ester. The alcohol may comprise a monoterpene alcohol or an alcohol ester. In one embodiment, the organic solvent comprises at least one of ester alcohol and alpha terpineol. The ester alcohol may be, for example, Texanol™.

The polymer material may comprise any type of suitable polymer material, depending on the application. The polymer material may comprise at least one of a resin, a thixotropic agent, a lubricant, a plasticizer, and a wax. The resin may comprise ethyl cellulose. The thixotropic agent may comprise modified castor oil derivative. The lubricant or plasticizer may comprise olefin co-polymers, poly-alkyl methacrylates, styrene polymers, etc.

In one embodiment, the raw material comprises: (i) about 3.5 to about 6.0 wt. % of a glass material; (ii) about 80 to about 88 wt. % of a composition comprising silver particles; (iii) about 10.8 to about 14.4 wt. % of an organic solvent; and (iv) about 1.2 to 1.6 wt. % of a polymer material.

In one embodiment, the raw material comprises (i) about 3.5 to about 6.0 wt. % of a glass material; (ii) about 65 to about 75 wt. % of a composition comprising silver particles; (iii) about 18 to about 27 wt. % of an organic solvent; and (iv) about 2 to 3 wt. % of a polymer material.

In some instances, additional filler material comprising non-electrically conductive material may be included in the raw material. In some instances, the raw material may also include incidental, inevitable impurities. The organic solvent and/or polymer material may be of any suitable content of the raw material, depending on the application. The content may change as a result of the different processing the raw material has undergone. For example, the product material comprises about 8-10 wt. % of at least one of (i) at least one an organic solvent and (ii) at least one polymer material. Other wt. % values are also possible.

Applications

The product material produced by the methods and systems described herein may be employed in a variety of applications. For example, the method may further comprise disposing the product material onto a substrate to for an electrical connect, in the case of a raw material comprising an electrically conductive material. The substrate may be a part of a device selected from the group consisting of a solar cell, an electronic device, an optoelectronic device, a printed sensor, a transparent conductive coating comprising at least one of carbon nanotubes, graphene, and indium tin oxide, advanced ceramics, a biosensor, an actuator, an energy harvesting device, a hybrid circuit, a sonar, a radar, a touch screen, a 3-D printing device, and a thermal management material.

Other types of applications are also possible. In one application the product material may be employed in Ag-filled polymer inks where low temperature curing is required (150° C.-250° C. range) for organic solar cell applications. In another application the product material may be employed in Ag inks (both high temperature and polymer-based) for touch screen applications, where fine line printing and high electrical conductivity are desirable. In one the product material may be employed in Ag or any precious or base metal electrically conductive inks/pastes for applications, including printed sensors, transparent conductive coatings that would be based on carbon nanotubes, graphene, indium tin oxide, etc., advanced ceramics (electrodes and termination materials), sensors including biosensors, actuators, energy harvesting devices, hybrid circuits, sonar, radar, 3-D printing, thermal management materials that are both electrically and thermally conductive based on Ag and/or graphene, etc.

NON-LIMITING WORKING EXAMPLE

Example 1

High Temperatures Crystalline p-Type Solar Cells

This example describes an exemplary formulation for high temperature crystalline p-type solar cells designed to accommodate printing of very fine gridlines (<50 um). Pre-existing typical peak firing (processing) temperatures are in the 700° C.-900° C. range. Furthermore, the formulation contains at least 3 different Ag particle sizes and shapes (ranging from nano-powders dispersed in a solvent to dry powders commercially available) to maximize the particle packing density to achieve an increased bulk electrical conductivity over industry standard formulations in the fired state after processing. Also, pre-existing inks contain one glass composition, while the ink/paste formulation employs multiple glass compositions with different softening points. This facilitates transporting more Ag to the emitter layer and also enhances the densification of the fired film through liquid phase sintering mechanisms. Denser films will have higher bulk electrical conductivities and the ability to transport more Ag to the emitter layer of the cell will result in higher efficiencies.

Based on the hydrodynamic cavitation process, with the equipment described, provided herein, solar thick film screen printable formulations (front gridline contact) with a thickness of 12-20 um and width of <50 microns were fabricated and listed in Table 1.

Pressures for processing the individual constituents and inks/pastes ranged from 1,000 psi to 30,000 psi. The orifice diameter sizes utilized to control the internal pressures, flow rates, particle size limitations and cavitation levels ranged from 0.005 inches to 0.050 inches. Flow rates for the materials in the cavitation systems are dependent on and commensurate with the various system configurations. Flow rates for small sample volumes were in the 100 ml per minute range while production throughputs approached and even exceeded 20-30 liters per minute. The back pressure created in the cavitation region of the device is important and varies depending on valve designs, orifice plate restrictions, and system orientation. Temperature control of the feed materials and the material flowing into the system is important and dependent on the organic constituent properties. Process conditions vary with respect to the order of the addition of the various materials, respective ink/paste viscosities, process times and the % of solid materials in the organic medium. Yields are about 100% once the system reached its initial charge volume that is highly beneficial when processing expensive raw materials such as precious metals.

TABLE 1

Exemplary Ink Formulation

| Component | Composition Range (wt. %) |
| --- | --- |
| Glass frit particles | 3.5-6.0 |
| Silver particles | 80-88 |
| Solvents | 10.8-14.4 |
| Polymer Constituents | 1.2-1.6 |

The temperature for processing the Ag solar front-side paste as described in Table 1 was about 38° C. to 48° C. The pressure range for processing was about 4,500 psi-45,000 psi. With respect to the orifice sizes of the cavitation machine, three different orifice sizes in sequence were used to create the pressure transitions need to form a vacuum and then cause the vacuum bubbles to implode. A primary orifice, then several secondary orifices, then a final orifice were used to create backpressure. The primary 0.020" orifice was used to break up larger agglomerates. After 3 passes, it was switched to primary orifice 0.015", secondary orifices 0.068", final orifice to create back pressure 0.038" all in sequences. This Example employed 12 passes (3 passes with primary 0.020", then remaining 9 with primary orifice 0.015").

The Ag average particle sizes were in the range of <0.1 microns to 3.0 microns. The range for the total particle size distribution was from 0.1 microns to 10 microns. Three different Ag powders spherical in nature were used to optimize packing density. The average particle sizes of the three various spherical powders were 0.2 um, 0.5 um, and 1.5 um. The ratio of each on a wt. % basis in the solar composition in this Example n is as follows: 4:2:94 (based on 87% total Ag weight in the solar ink formulation). The weight ratios vary depending on the solar gridline width requirements. The primary larger constituent remains the primary component for Ag spheres and was >80% while the smaller sizes may each range from 0-15 wt. %.

Borosilicate glasses comprising silicon-boron-lead-aluminum (that may have a substitute such as bismuth for lead)

were utilized in the ink/paste formulations described in this Example. The glass composition for this Example is 4.5 wt. % and is based on 2 different glass compositions that have properties in the ranges specified above. The higher temperature melting glass is typically the major constituent with a ratio of 8:1 for the 2-glass mixture. The lower temperature melting glass composition assists in the liquid phase sintering of the Ag particles and uniform etching through the antireflective coating layer to make contact at the emitter layer where the charge carriers reside.

The organic solvent and polymer constituents are in the wt. % range shown in Table 1. Solvents are Texanol™ and alpha terpineol in an 8:1 ratio, while the polymer constituents may vary based on the gridline geometry requirements. Typical polymer constituents include ethyl celluloses, thixotropic agents, plasticizers and waxes. The % of organic vehicle (in the ink/paste formulation) which is synthesized from the solvents and various polymers into the single carrier composition is in the 8-10 wt. %.

Example 2

Low Temperature Ag Inks for Solar Cells

Silver (Ag) conductive ink/paste formulations in this Example were developed for the next generation of solar cell designs, such as the back passivated solar cells. The designs described in this Example utilize cell construction configurations that will increase the long wavelength carrier collection due to improved back side reflectance (BSR) and reduced back surface recombination velocity (BSRV). The low BSRV and high BSR will lead to higher solar cell efficiencies. In contrast to the requirements of typical front Ag gridlines on pre-existing solar cells in production, the Ag inks described in this example adhere strongly to back side dielectric after sintering at low temperature (250° C.-450° C.) to give very high conductivity (<2 micro-ohm·cm) and preserve the passivation property of the back side dielectric.

These Ag inks contain a glass constituent that has low softening and melting points, as well as a low glass transition temperature. These glass powders soften, melt, and flow in order to provide liquid-phase assisted sintering at temperatures at or below 450° C. with an optimum maximum below 400° C. In contrast, Ag inks for pre-existing front-side gridlines are designed for processing above 700° C.

The Ag film formed in this Example have the following characteristics: The Ag and glass powders and/or flakes have a fine and narrow particle size distribution in order to achieve densification and acceptable electrical conductivity at such a low cell processing temperature. The Ag film forms an acceptable electrical contact to the rear contacts that are typically Ag/Al or Ag pads or vias. The Ag film does not penetrate the passivation layer to any extent but must have good adhesion to same. The Ag film is able to be deposited by screen-printing or an alternative deposition method. If the electrical conductivity is high enough, the film thickness is minimized, thus saving significant materials costs. The composition of the Ag screen-printable formulation for such designs described in this Example is shown in Table 2.

TABLE 2

Exemplary Ink Formulation

| Component | Preferred Composition Range (wt. %) |
| --- | --- |
| Glass frit particles | 3.5-6.0 |
| Silver particles | 65-75 |

TABLE 2-continued

Exemplary Ink Formulation

| Component | Preferred Composition Range (wt. %) |
| --- | --- |
| Solvents | 18-27 |
| Polymer Constituents | 2.0-3.0 |

The temperature for processing the Ag solar front-side paste as described in Table 1 was about 30° C. to 45° C. The pressure range for processing was about 1,000 psi-20,000 psi. With respect to the orifice sizes of the cavitation machine, three different orifice sizes in sequence were used to create the pressure transitions need to form a vacuum and then cause the vacuum bubbles to implode. A primary orifice, then several secondary orifices, then a final orifice were used to create backpressure. The primary 0.020" orifice was used to break up larger agglomerates. After 3 passes, it was switched to primary orifice 0.015", secondary orifices 0.068", final orifice to create back pressure 0.038" all in sequences.

Borosilicate glasses comprising silicon-boron-lead-aluminum (that may have a substitute such as bismuth for lead) were utilized in the ink/paste formulations described in this Example. The glass compositions have softening points in the range of 330° C. to 350° C. The glass transition temperature range is from 250° C.-270° C. The particle size ranges for the glass and Ag flakes and spheres are the same as described in Example 1.

Additional Notes

All literature and similar material cited in this application, including, but not limited to, patents, patent applications, articles, books, treatises, and web pages, regardless of the format of such literature and similar materials, are expressly incorporated by reference in their entirety. In the event that one or more of the incorporated literature and similar materials differs from or contradicts this application, including but not limited to defined terms, term usage, described techniques, or the like, this application controls.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention may be implemented in any of numerous ways. For example, some embodiments may be implemented using hardware, software or a combination thereof. When any aspect of an embodiment is implemented at least in part in software, the software code may be executed on any suitable processor or collection of processors, whether provided in a single computer or distributed among multiple computers.

In this respect, various aspects of the invention may be embodied at least in part as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium or non-transitory medium) encoded with one or more programs that, when executed on one or more computers or other processors, perform methods that implement the various embodiments of the technology discussed above. The computer readable medium or media may be transportable, such that the program or programs stored thereon may be loaded onto one or more different computers or other processors to implement various aspects of the present technology as discussed above.

The terms "program" or "software" are used herein in a generic sense to refer to any type of computer code or set of computer-executable instructions that may be employed to program a computer or other processor to implement various aspects of the present technology as discussed above. Additionally, it should be appreciated that according to one aspect of this embodiment, one or more computer programs that when executed perform methods of the present technology need not reside on a single computer or processor, but may be distributed in a modular fashion amongst a number of different computers or processors to implement various aspects of the present technology.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one." Any ranges cited herein are inclusive.

The terms "substantially" and "about" used throughout this Specification are used to describe and account for small fluctuations. For example, they may refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" may refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

What is claimed:

1. A method of making, comprising:
   providing a raw material including particles comprising an electrically conductive material and having a first viscosity of at least 1 Kcps at room temperature;
   forcing the raw material through an orifice of a hydrodynamic cavitation chamber using an air-driven piston to subject the raw material to a pressure in the range of 100 psi to 100,000 psi and to heat the raw material to a first temperature in the range of 20° C. to 100° C., such that the raw material has a second viscosity lower than the first viscosity; and
   subjecting the raw material having the second viscosity to a hydrodynamic cavitation process by passing the raw material sequentially through a primary orifice, a secondary orifice, and a final orifice within the cavitation chamber to make a product material having a third viscosity.

2. The method of claim 1, further comprising cooling the product material to a predetermined second temperature using at least a feedback temperature control.

3. The method of claim 1, further comprising disposing the product material onto a substrate to form a pattern on the substrate, which substrate is a part of a device selected from the group consisting of a solar cell, an electronic device, an optoelectronic device, a printed sensor, a transparent conductive coating comprising at least one of carbon nanotubes, graphene, and indium tin oxide, advanced ceramics, a biosensor, an actuator, an energy harvesting device, a hybrid circuit, a sonar, a radar, a touch screen, a 3-D printing device, and a thermal management material.

4. The method of claim 1, further comprising repeating the forcing and subjecting at least once.

5. The method of claim 1, wherein at least one of the subjecting and the forcing is in a closed system.

6. The method of claim 1, wherein the method is automated.

7. The method of claim 1, wherein the second viscosity is less than or equal to about 50% of the first viscosity.

8. The method of claim 1, wherein the third viscosity is less than or equal to about 75% of the first viscosity.

9. The method of claim 1, further comprising reducing a first size of the particles contained in the raw material to form particles having a second size in the product material, the second size being smaller than the first size.

10. The method of claim 1, further comprising de-agglomerating the particles having a first size contained in the raw material to form particles having a second size in the product material, the second size being smaller than the first size.

11. The method of claim 1, further comprising dispersing the particles such that no visually observable agglomeration of the particles is observed in the product material.

12. The method of claim 1, wherein the product material comprises particles which do not agglomerate for at least one year.

13. The method of claim 1, wherein the electrically conductive material comprises at least one of:
    (i) at least one of: Ag, Pd, Au, Pt, Ni, Cu, Ru, or an alloy thereof; and
    (ii) at least one of: carbon black, graphene, carbon nanotubes, and graphite.

14. The method of claim 1, wherein the particles comprising at least one electrically conductive material in the raw material having the first viscosity have at least three average particle sizes distribution.

15. The method of claim 1, wherein the raw material comprises at least one glass material comprising a borosilicate.

16. The method of claim 1, wherein the raw material comprises at least two glass materials, comprising:
    a first glass material having a first transition temperature;
    a second glass material having a second transition temperature, the second transition temperature being higher than the first transition temperature;
    wherein a weight ratio of the first glass material and the second glass material in the raw material is 8:1.

17. The method of claim 1, wherein the raw material comprises at least one glass material having at least one of the following:
    (i) a softening temperature between about 400° C. and about 460° C.;
    (ii) a glass transition temperature between about 320° C. and about 385° C.; and
    (iv) an average particle size between about 0.1 microns and 3 microns.

18. The method of claim 1, wherein the raw material comprises at least one organic solvent comprising at least one of ester alcohol and alpha terpineol.

19. The method of claim 1, wherein the raw material comprises at least one polymer material comprising at least one of a resin, a thixotropic agent, a lubricant, a plasticizer, and a wax.

20. The method of claim 1, wherein the raw material comprises a composition comprising the particles comprising silver, at least one glass material, at least one organic solvent, and at least one polymer material.

21. The method of claim 1, wherein the product material comprises about 8-10 wt. % of at least one of (i) at least one an organic solvent and (ii) at least one polymer material.

22. The method of claim 1, wherein the raw material comprises: (i) about 3.5 to about 6.0 wt. % of a glass material; (ii) about 80 to about 88 wt. % of a composition comprising silver particles; (iii) about 10.8 to about 14.4 wt. % of an organic solvent; and (iv) about 1.2 to 1.6 wt. % of a polymer material.

23. The method of claim 1, wherein the raw material comprises: (i) about 3.5 to about 6.0 wt. % of a glass material; (ii) about 65 to about 75 wt. % of a composition comprising silver particles; (iii) about 18 to about 27 wt. % of an organic solvent; and (iv) about 2 to 3 wt. % of a polymer material.

24. The method of claim 1, wherein the temperature is between about 35° C. and about 50° C.

25. The method of claim 1, wherein the pressure is between about 1,000 and about 50,000 psi.

26. The method of claim 1, further comprising determining the pressure and the temperature.

27. The method of claim 1, further comprising disposing the product material onto a substrate to form a p-type solar cell.

28. The method of claim 1, wherein:
- a size of the primary orifice differs from a size of the at least one secondary orifice and a size of the final orifice; and
- the size of the at least one secondary orifice differs from the size of the final orifice.

29. The method of claim 1, wherein:
- causing the raw material to sequentially pass through the primary orifice, the at least one secondary orifice, and the final orifice within the cavitation chamber creates pressure transitions to form a vacuum within the raw material and to cause vacuum bubbles to implode within the raw material.

30. The method of claim 1, wherein the first orifice has a diameter of 0.020", the at least one second orifice has a diameter of 0.015", and the final orifice has a diameter of 0.038".

* * * * *